United States Patent
Absar et al.

(10) Patent No.: US 7,177,812 B1
(45) Date of Patent: Feb. 13, 2007

(54) UNIVERSAL SAMPLING RATE CONVERTER FOR DIGITAL AUDIO FREQUENCIES

(75) Inventors: Mohammed Javed Absar, Singapore (SG); Sapna George, Singapore (SG); Antonio Mario Alvarez-Tinoco, Singapore (SG)

(73) Assignee: STMicroelectronics Asia Pacific PTE Ltd, Singapore (SG)

( * ) Notice: Subject to any disclaimer, the term of this patent is extended or adjusted under 35 U.S.C. 154(b) by 768 days.

(21) Appl. No.: 10/312,205

(22) PCT Filed: Jun. 23, 2000

(86) PCT No.: PCT/SG00/00093

§ 371 (c)(1),
(2), (4) Date: Jun. 12, 2003

(87) PCT Pub. No.: WO01/99277

PCT Pub. Date: Dec. 27, 2001

(51) Int. Cl.
    *G10L 21/00* (2006.01)
(52) U.S. Cl. .................................. 704/265
(58) Field of Classification Search ............... None
    See application file for complete search history.

(56) References Cited

U.S. PATENT DOCUMENTS

| | | | |
|---|---|---|---|
| 5,309,484 A | 5/1994 | McLane et al. | 375/106 |
| 5,724,396 A * | 3/1998 | Claydon et al. | 375/355 |
| 5,793,818 A * | 8/1998 | Claydon et al. | 375/326 |
| 6,618,443 B1 * | 9/2003 | Kim et al. | 375/240.21 |

FOREIGN PATENT DOCUMENTS

EP     0 450 335 A1   10/1991

OTHER PUBLICATIONS

Miao, G. et al., "Pre-interpolation Filters for Upsampling," *Motorola Technical Developments*, vol. 34, pp. 141-144, Mar. 1998.
Pyfer, M. et al., "The Design and Application of Optimal FIR Fractional-Slope Phase Filters," in *Proceedings of the ICASSP 87*, Dallas, Apr. 6-9, 1987, pp. 896-899, XP-002160241.

* cited by examiner

*Primary Examiner*—Susan McFadden
(74) *Attorney, Agent, or Firm*—Lisa K. Jorgenson; Dennis M. de Guzman; Seed IP Law Group PLLC

(57) ABSTRACT

A method for conversion of input audio frequency data, at an input sample frequency, to output audio frequency data, at an output sample frequency. The input data is subjected to expansion to produce expanded data at an output sample frequency. The expanded data is interpolated to produce output data. In one embodiment of the invention the interpolation is effected by a process that also filters the output data. In another embodiment, the input data is sampled by an integer factor to produce expanded data, the expanded data is then interpolated to produce the output data. Also disclosed is a method of transition of a signal output, at one frequency, to a signal output at another frequency. The signal output at said one frequency is faded out over a period, and the signal output at said other frequency is faded in over that period. Both signal outputs are combined to produce the signal output over said period. Apparatus for effecting the methods is also disclosed.

23 Claims, 4 Drawing Sheets

UNIVERSAL SAMPLING RATE CONVERTER FOR DIGITAL AUDIO FREQUENCIES

FIELD OF THE INVENTION

This invention relates to methods and apparatus for conversion of input audio frequencies to output audio frequencies.

BACKGROUND OF THE INVENTION

Digital Audio is based on many different means of communication. The different digital media generally have conflicting sampling frequencies, where those sampling frequencies are in accordance with the Nyquist Sampling theorem. For example, digital transmission of broadcasting programs at 32 kHz, compact discs at 44.1 kHz, digital video discs at 48 kHz and speech recordings at 6 kHz to 8 kHz, as described in "High Quality Digital Audio in the Entertainment Industry", IEEE ASSP Magazine 1985 pages 2–25. Digital audio requires a sampling frequency conversion technique to handle simple as well as non-trivial ratios efficiently.

Conversion by going from digital to analogue (through a DAC and a low-pass filter) and then re-sampling the smoothed signal at the output rate is simple, but costly and limited by the imperfections (non-linearity, phase response, noise) of the analogue filter as described in "High, Quality Analogue Filters for Digital Audio", 67$^{th}$ AES Convention, November 1980.

Conversion in simple integer or rational ratios $f_i/f_0$ by single or multi-stage FIR filter design, as described in Rabiner and Croichie, Multi-rate Digital Signal Processing, Prentice Hall Publication, 1983. However, it is not particularly suited for many arbitrary ratios, as it leads to far too many filter configurations. An individual filter configuration is suited maximally to a subset of these ratios only.

SUMMARY OF THE INVENTION

In accordance with the present invention, there is provided a method for conversion of input audio data, at an input audio data frequency, to output audio data, at an output audio data frequency, including the steps of:
  (a) sampling the input audio data;
  (b) expanding the input audio data, to produce expanded data; and
  (c) interpolating the expanded data to produce output audio data, wherein the step of interpolating bandlimits the expanded data to either the sampling frequency divided by two or the output audio data frequency divided by two, which ever is the lesser.

Preferably, the step of interpolating includes sinc interpolation substantially in accordance with a sinc interpolation function.

Preferably, said sinc interpolation function is substantially in accordance with:

$$x_c(t) = \frac{1}{f_s} \int_{-A}^{+A} \left[ \sum_{k=\infty}^{\infty} x[k] e^{-j2\pi \frac{Fk}{f_s}} \right] e^{j2\pi Ft} dF \text{ where}$$

-continued $x_c(t)$ = output audio data
$x(t)$ = input audio data
$F_s$ = sampling frequency
$F'$ = output audio data frequency
$A$ = minimum $[Fs/2, F'/2]$
$x[k]$ = uniform samples of the input audio data $x(t)$
$k$ = sampling time with respect to frequency In accordance with the present invention, there is also provided a method for conversion of input audio data, at an sample frequency, to output audio data, at an output audio data frequency, including the steps of:
  (a) upsampling the input audio data by an integer factor, so as to increase the sampling rate of the input data to produce expanded data; and
  (b) interpolating the expanded data to produce the output data wherein the interpolating is linear interpolation, the upsampling includes polyfhase filters for filtering the expanded data, and said upsampling includes a commutator for selecting the outputs of the filters.

Preferably, the commutator, at any one time, selects only two outputs from the polyphase filters.

In accordance with the present invention, there is also provided a frequency converter for conversion of input audio data, at an input audio data frequency, to output audio data, at an output audio data frequency, including:
  (a) means for sampling the input audio data;
  (b) means for expanding the input audio data to produce expanded data; and
  (c) means for interpolating the expanded data to produce output audio data, where the step of interpolating bandlimits the expanded data to either the sampling frequency divided by two or the output audio data frequency divided by two, which ever is the lesser.

In accordance with the present invention, there is also provided a frequency converter for conversion of input audio data, at an input audio data frequency, to output audio data, at an output audio data frequency, including:
  (a) means for upsampling the input audio data by an integer factor, so as to increase the sampling rate of the input audio data to produce expanded data and
  (b) means for interpolating the expanded data to produce output audio data, wherein the interpolating is linear interpolation, said upsampling includes polyphase filters for filtering said expanded data, and said polyphase filters are in parallel and said upsampling includes a commutator for selecting the outputs of the filters.

Preferably, a frequency converter as claimed in claim 11, wherein the commutator at any one time selects only two outputs from the polyphase filters.

Advantageously the invention will be a single simple structure, often desired in Audio applications, for conversion between commonly occurring audio frequencies. The advantage of using a single structure is that for conversion between different frequency combinations, the same block code and same coefficients can be used. This reduces the program code size. A single simple structure also means it can be implemented efficiently as a hardware block, without excessive chip area.

DETAILED DESCRIPTION OF THE DRAWINGS

The invention is further described by way of examples only with reference to; the accompanying drawings, in which.

DETAILED DESCRIPTION OF THE PREFERRED EMBODIMENT

Figure 1:
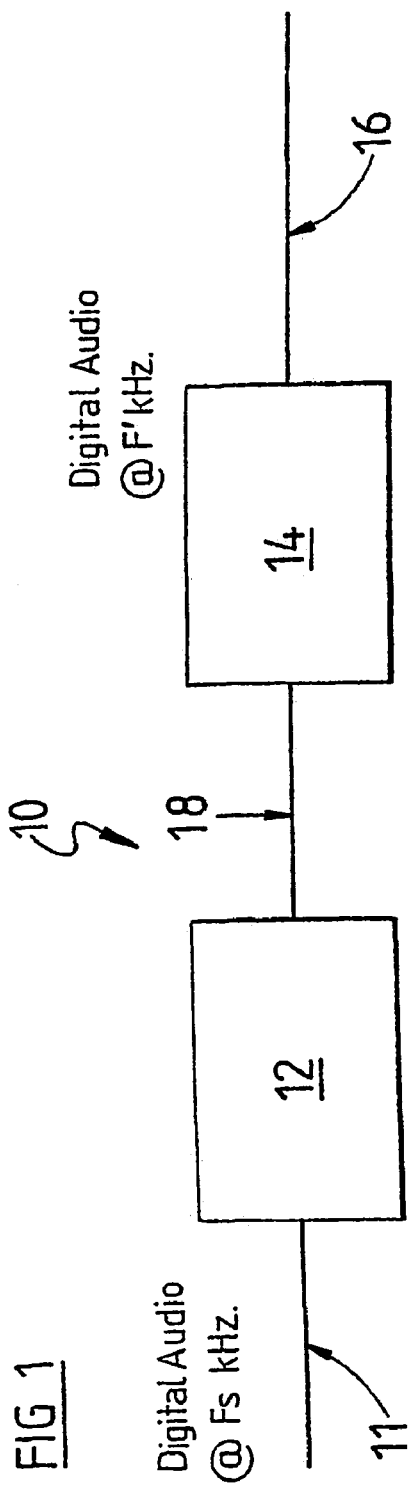
FIG. 1 is a block diagram of a digital frequency converter of a general kind described as prior art.

FIG. 1 shows an audio frequency converter 10 according to the prior art. This employs a digital expansion stage 12, where the sampling frequency is increased to a significantly high integral value, such as a suitable power of 2, followed by an analogue interpolation stage 14 where sample values, at points corresponding to output sampling frequency, are computed.

Consider that x[n] is a uniformly sampled version of the bandlimited analogue signal x(t). If the sampling frequency is $F_s$, therefore the time period is $T_s$, then $x[n]=x(nT_s)$.

Moreover, if x(t) was band-limited to $F_s/2$, then perfect reconstruction of x(t) from x[n] can be obtained by applying the interpolation function (sampling theorem)

$$x(t) = \sum_{k=\infty}^{\infty} x[k]\phi_k(t) \quad (1)$$

where $$\phi_k(t) = \frac{\omega_c T_s}{\pi} \frac{\sin[\omega_c(t-kT_s)]}{\omega_c(t-kT_s)} \quad (2)$$

and $\omega_c = \pi f_s$; the cutoff frequency

Since the summation limit is from $-\infty$ to $\infty$ it cannot be practically implemented. If non-uniform sampling or finite length is considered (about the point of reconstruction) other types of interpolation functions such as spline and Lagrange can be used. Equation (3) is an example of a Lagrange interpolator.

$$\phi_k(t) = \prod_{i=N_1}^{N_2} \frac{t-t_i}{t_k-t_i}; \text{ where } i \neq k \quad (3)$$

The advantage of the Lagrange interpolator is that it results in a polynomial fit, constructed in such a way that each sample is represented by a function which has zero values at all other sampling points.

Evaluating x(t) for all possible values is physically impossible. However, reconstruction only requires evaluation of x(t) at points t=mT', corresponding to re-sampling with new sampling frequency $F_s$, with an associated period T'. Therefore:

$$n = \text{the integer value of } [mT'/T_s] \text{ and} \quad (4)$$

$$\Delta t = mT' - nT_s \text{ Thus}$$

$$x(mT') = x(nT_s + \Delta t) \text{ where } 0 < \Delta t \leq T$$

$$= \sum_{k=-N}^{N} x[n+k]\phi_k(\Delta t)$$

The above described technique functions adequately when $F_s<F'$. However, when reconstructing audio data where Fs>F', the output audio data will be effected by an effect called aliasing. Aliasing is frequency fold over due to under sampling and can be removed by prefiltering the audio data to effectively bandlimit the audio data to F'/2. This step requires prefiltering of data before reconstruction.

Figure 2:
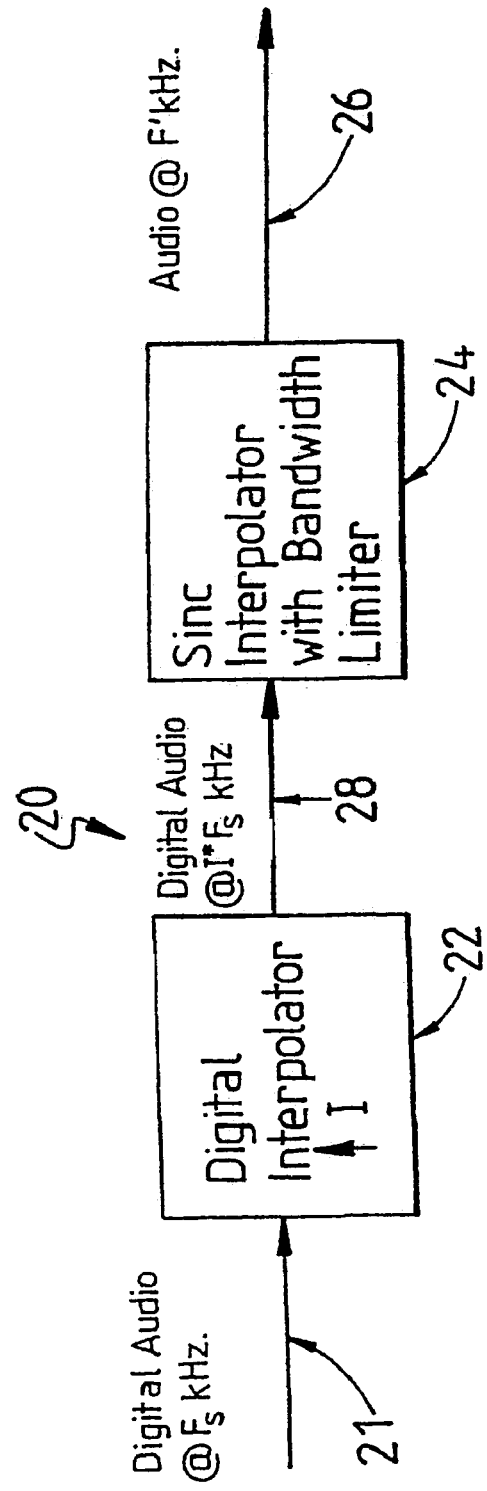
FIG. 2 is a block diagram of a digital frequency converter construction in accordance with the invention.

In converters constructed by FIG. 1, and operating as above mentioned, if the interpolator 14 is a Lagrange, spline or linear interpolator, pre-filtering of the extended input data generally needs to be effected in order to remove the mentioned aliasing effect. Converter 20, shown in FIG. 2 and constructed in accordance with the principles of this invention, depicts a digital expansion stage 22 followed by sinc interpolation 24. By this experience it is possible to avoid said pre-filtering, such as is necessary when using these Lagrange, spline and linear interpolators.

$$x_c(t) = \frac{1}{f_s} \int_{-A}^{+A} \left[ \sum_{k=\infty}^{\infty} x[k] e^{-j2\pi \frac{Fk}{f_s}} \right] e^{j2\pi Ft} dF \quad (5)$$

where

A=minimum $[F_s/2, F'/2]$

Equation (5) represents a sinc interpolation reconstruction formula in accordance with the invention. The integral limits, ±A, of this function effectively bandlimit the interpolation. The interpolation is bandlimited to effect filtering of the data output by the interpolation. Therefore, when $F_s$ is less than F', the equation (5) will function as a standard sinc interpolator whereby the data reconstructed by the interpolation will be bandlimited to $F_s/2$. However, when Fs is greater than F', equation (5) will function as a sinc interpolator whereby the data reconstructed by the interpolation will be bandlimited to F'/2. Thus, the reconstructed data will be bandlimited to F'/2 and thereby be filtered from an aliasing effect.

Therefore, the prefiltering step, to remove an aliasing effect in reconstructed data, is no longer required. The cutoff frequency, $\omega_c$, is effectively constrained to the minimum of ($\pi F_s$, $\pi F'$), thereby limiting the integral of the reconstruction formula of equation 5, to A. Sinc interpolation may therefore interpolate and filter the expanded data in a single step.

Figure 3:
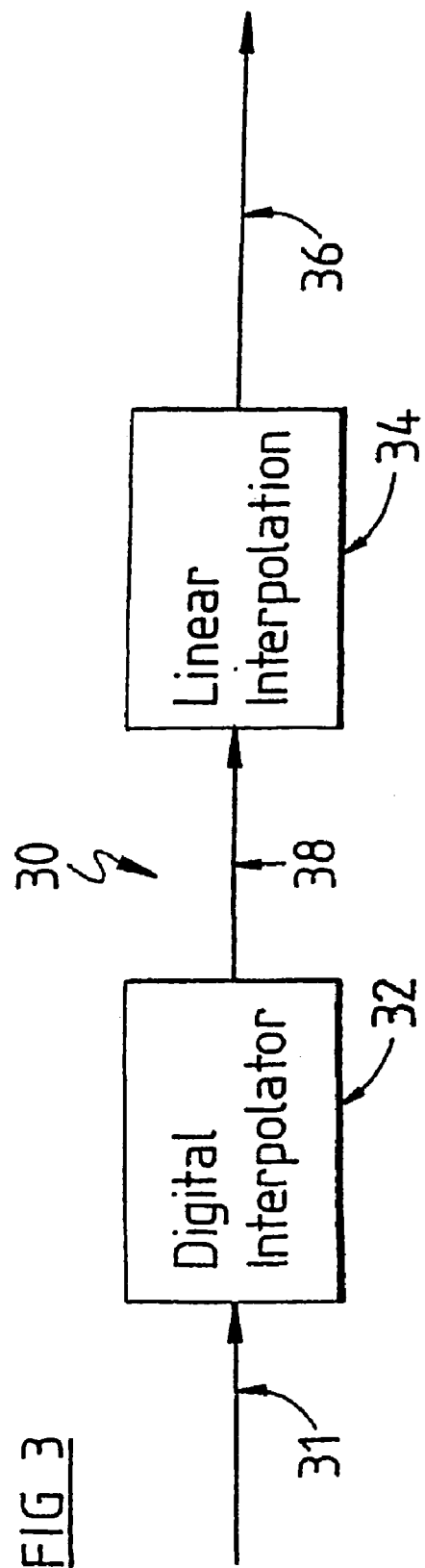
FIG. 3 is a block diagram of a digital frequency converter construction in accordance with the invention.

FIG. 3 illustrates yet another converter in accordance with the invention. Converter 30 has a first stage 32 where the sampling rate, $F_s$, of the input audio data is increased digitally by an integer factor L, giving an output y[n] at L*$F_s$. y[n] is also referred to as expanded data.

The second stage 34 may comprise a simple linear interpolator, which interpolates the denser expanded samples of y[n] at frequency L*$F_s$ to generate output at required frequency F'36. Upsampling reduces the interpolation error considerably.

This process is known as 'upsampling'. Upsampling reduces the errors which occur during interpolation considerably. Upsampling by a factor of 16 followed by linear interpolation leads to SNR of ~60 dB for conversion ratio F'/$F_s$=4.

Converter 30 is simplified by using the same interpolation factor, 16, for all conversion ratios. In effect, the said common interpolation factor enables the same filter coefficients to be used for all ratios. Upsampling may include a normal polyphase filter.

Figure 4:
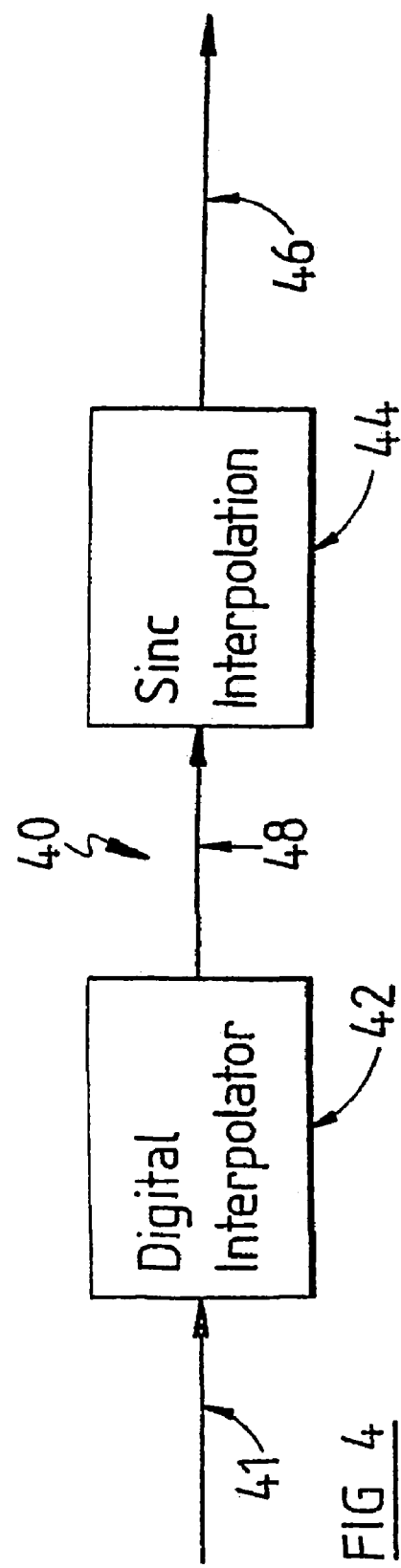
FIG. 4 is a block diagram of a digital frequency converter construction is accordance with the invention.

FIG. 4 illustrates another converter in accordance with the invention. The converter 40 has a first stage 42 where the sampling rate of the input digital data is increased digitally by an integer factor L, giving the output y[n] at sampling rate L*$F_s$. The second stage 44 comprises a sinc interpolator, which interpolates the expanded samples at frequency L*$F_s$ 48 to generate out put at required frequency F' 46. Upsampling reduces the interpolation error considerably.

Converter 40 is simplified by using the same interpolation factor, 16, for all conversion ratios. In effect, the said common interpolation factor enables the same filter coefficients to be used for all ratios. A polyphase filter implements the upsampling stage.

Figure 5:
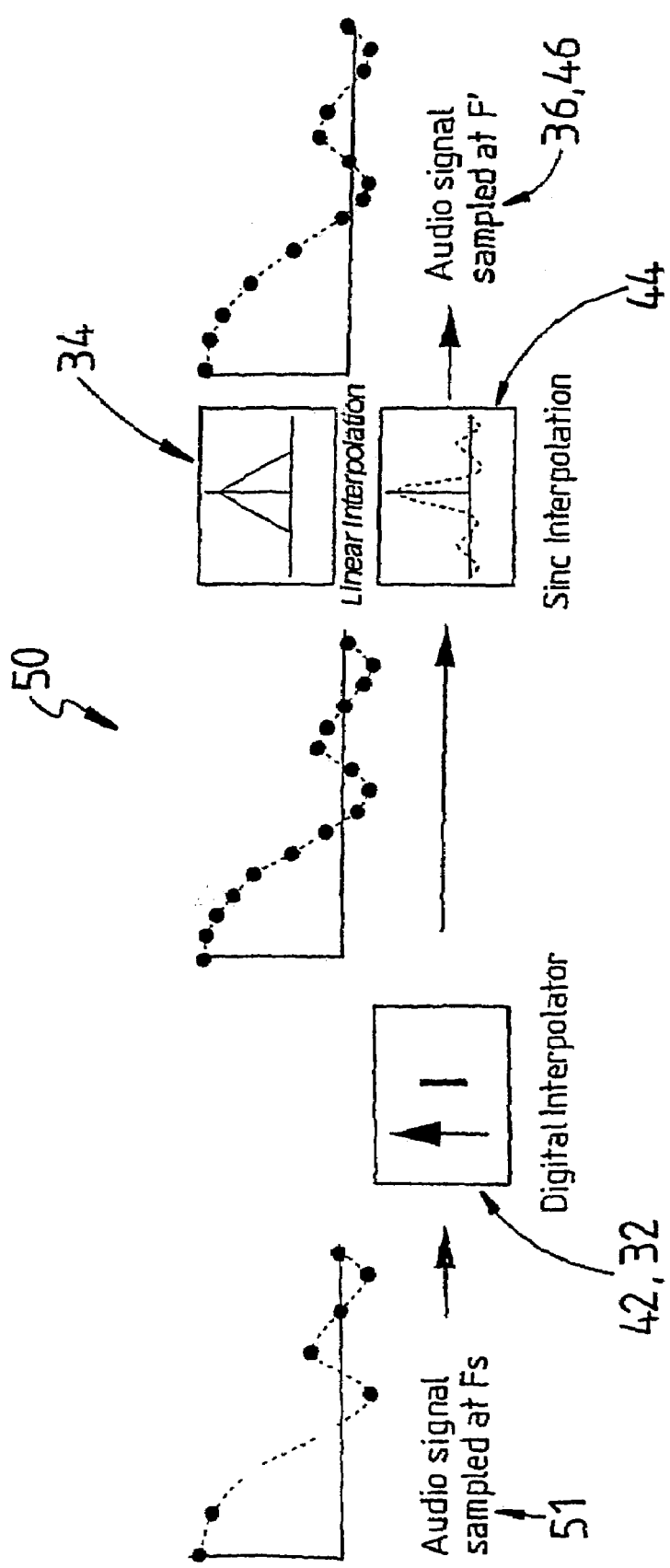
FIG. 5 is a flow diagram depicting sinc and linear interpolation techniques which may be affected in the FIG. 3.

For simple operations converter 30, would be used in preference to converter 40. FIG. 5 illustrates processes effected in the converters 30 and 40.

Upsampling, in the embodiments of FIGS. 3, 4 and 5, is generally performed by inserting I-1 zeros between every two consecutive samples and then filtering the expanded result, where I is the degree of up sampling. If the converter is constructed in accordance with FIG. 4, then filtering is performed in a single step as a part of the interpolation process.

Insertion of I-1 zeros means that Y'(z)=X($z^I$), where y'[n] is the sequence generated by inserting I-1 zeros in x[n]. In the frequency domain Y'($e^{jw}$)=X($e^{jwI}$), which essentially means that the spectrum of x[n] has been co pressed I times. Since X($e^{jwI}$) is periodic in $2\pi$ this leads to creation of extra images in the spectrum. These images are removed by a filter with a bandlimit of $\omega_c=\pi/I$.

Computational efficiency is obtained in the filter structure above by reducing the large FIR polyphase filter (h[n]) of length M into a set of smaller polyphase filters of length K=M/I. Since the upsampling process inserts I-1 zeros between successive values of x[n], only K out of M input values stored in the FIR filter at any time are non-zero. This observation leads to the well-known polyphase filters $$p_k(n) = h(k + nI) \quad k = 0, 1, ..., I - 1.$$

$$n = 0, 1, ..., K - 1$$

Figure 6:
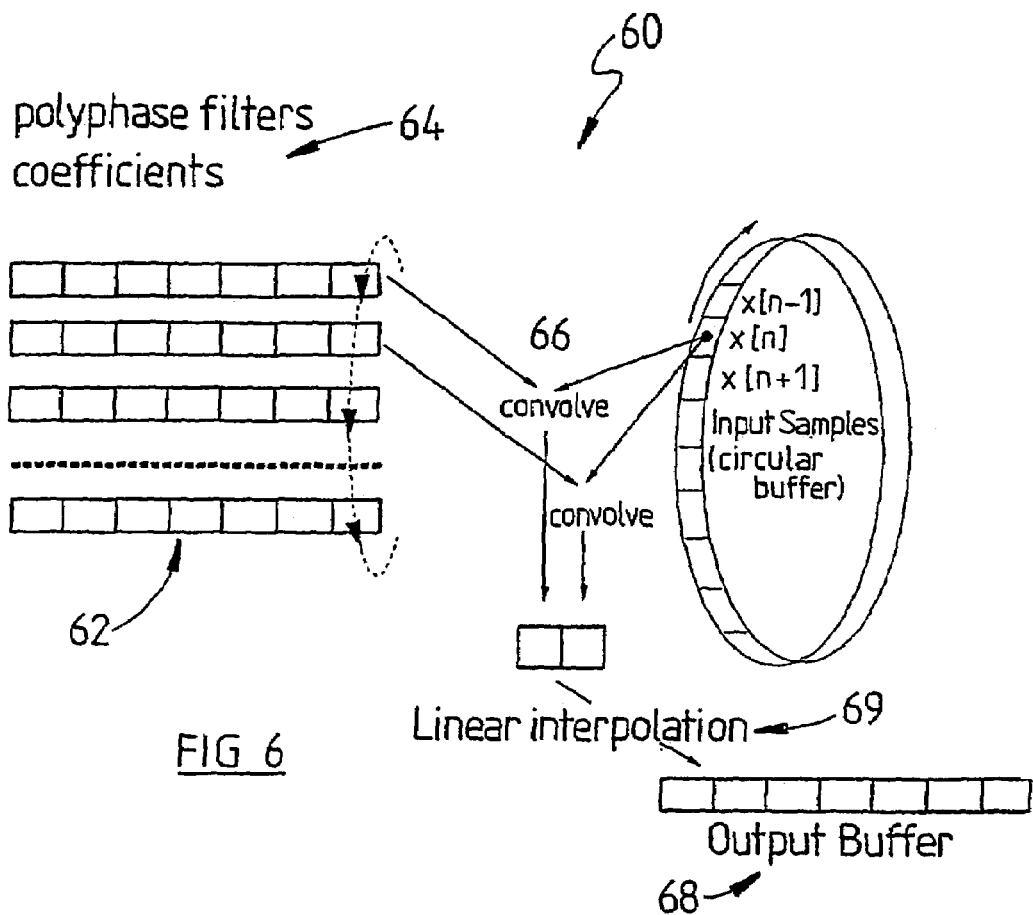
FIG. 6 is a diagram depicting processing steps occurring in the use of the digital frequency converter of FIG. 3.

The set of I polyphase filers can be arranged as a parallel realisation 62, as shown in FIG. 6, where the output of each filter 64 can be selected by a commutator 66.

In the case of linear interpolation, two adjacent polyphase filter outputs are required at each time. Further reduction in computation is achieved by noting that in the case of linear interpolation, not all polyphase filter outputs are used in generating the samples at the output.

In a specific example of converter 30, the process of FIG. 6, rate conversion from 16 kHz. to 44.1 kHz. The input to the system are samples x[n] at 16 kHz. After upsampling by 16 samples y[n] are produced at frequency 16×16 kHz.=256 kHz. The output {z[0], z[1], z[2], . . . } at 441.1 kHz. are interpolations of samples pairs {(y[0],y[1]), (y[5],y[6]), (y[11],y[12]), . . . } corresponding to the ratio 256/44.1=5.8049. Since only specific points are required others need not be computed. In the polyphase approach, above described, each polyphase filter 62 generates an output 64 and the commutator 66 moves to the next polyphase. At the end of a cycle the commutator returns to the first filter.

Since only specific polyphase outputs are required computation can be reduced by skipping those polyphase filters whose output are not required for that period of time. Unless the conversion ratio is an integer no polyphase filter can be absolutely avoided. The above described example, achieves a computation gain of about four.

Internal clock inconsistencies may be a problem in digital frequency conversion. Consider the example of conversion from 32 kHz. to 44.1 kHz. Real-time systems work on limited buffer space and on blocks of data. Suppose the constraint on the system is that it always operates on N output samples. Each time N samples are transmitted at the output the system receives an interrupt for DMA (Direct Memory Access) and all the samples collected at input since the last DMA is copied to internal buffer. Similarly N samples must be ready to be transferred to the output buffer.

Now, the input and output clocks are free running so there is no guarantee that the ratio between the time periods of the two clocks will be exactly as computed. As a result it may happen that either the number of samples obtained from input is too few to produce N samples at output or they produce more than N samples.

If $F_s$ is the input sampling frequency and F' is the required output sampling frequency, each time N samples are transmitted at output, [N*$F_s$/F'] samples should accumulate at the input. A small deviation may occur, but on average the above relation must hold. In a case where the deviation is appreciable, samples may have to be dropped. This case arises when the input rate is higher than the output rate. As a result of being dropped samples may have to be repeated.

Therefore, when the input data frequency is higher than the output data frequency, more samples are produced at the output, than the buffer 68 can hold. Overwriting the older samples in the buffer produces a discontinuity and as a result a clicking sound is made.

Figure 7:
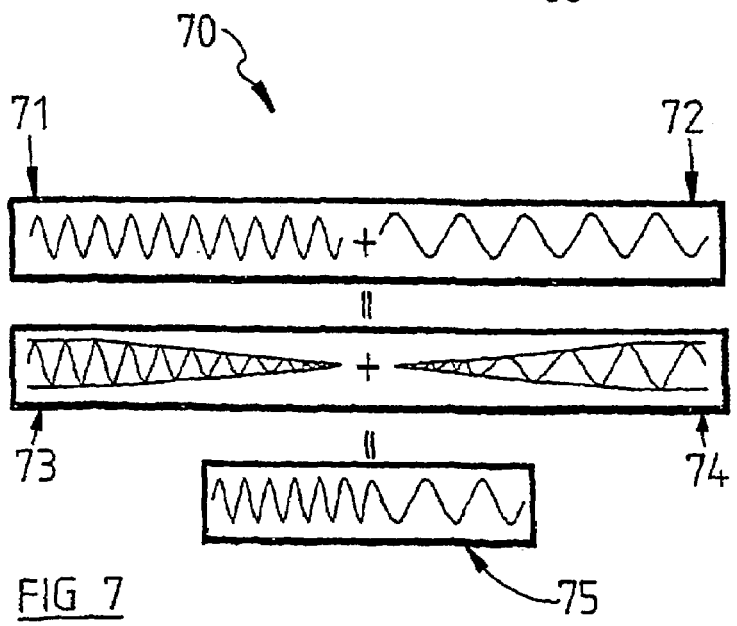
FIG. 7 is a diagram illustrating a cross-fading technique, in accordance with the invention.

In the cross fading scheme of FIG. 7, the output data frequency 72 is less than the input data frequency 71. To enable a smooth transition, the input data frequency is faded in over time as indicated by 73 and the output data frequency is faded out over time by 74. The result is the smooth transition 75.

The claims defining the invention are as follows:

1. A method for conversion of input audio data, at an input audio data frequency, to output audio data, at an output audio data frequency, the method including:
    sampling the input audio data;
    expanding the input audio data, to produce expanded data; and
    interpolating the expanded data to produce output audio data, wherein interpolating bandlimits the expanded data to either a sampling frequency divided by two or the output audio data frequency divided by two, whichever is the lesser.

2. A method as claimed in claim 1, wherein interpolating includes sinc interpolation substantially in accordance with a sinc interpolation function.

3. A method as claimed in claim 2, wherein said sinc interpolation function is substantially in accordance with:

$$x_c(t) = \frac{1}{f_s}\int_{-A}^{+A}\left[\sum_{k=\infty}^{\infty} x[k]e^{-j2\pi\frac{Fk}{f_s}}\right]e^{j2\pi Ft}dF \text{ where}$$

$x_c(t) =$ output audio data
$x(t) =$ input audio data
$F_s =$ sampling frequency
$F' =$ output audio data frequency
$A =$ minimum $[Fs/2, F'/2]$
$x[k] =$ uniform samples of the input audio data $x(t)$
$k =$ sampling time with respect to frequency.

4. A method as claimed in claim 1, wherein said interpolating effects bandlimited interpolation of said sampled input audio data and thereby substantially filters said output audio data to remove an aliasing effect in the one act.

5. A method for conversion of input audio data, at a sample frequency, to output audio data, at an output audio frequency, the method including:
    upsampling the input audio data by an integer factor, so as to increase a sampling rate of the input audio data to produce expanded data; and
    interpolating the expanded data to produce the output audio data wherein the interpolating is linear interpolation, the upsampling includes polyphase filters for filtering the expanded data, and said upsampling includes using a commutator for selecting outputs of the filters.

6. A method claimed in claim 5, wherein the commutator, at any one time, selects only two outputs from the polyphase filters.

7. A frequency converter for conversion of input audio data, at an input audio data frequency, to output audio data, at an output audio data frequency, the frequency converter including:
    means for sampling the input audio data;
    means for expanding the input audio data to produce expanded data; and
    means for interpolating the expanded data to produce output audio data, where the means for interpolating bandlimits the expanded data to either a sampling frequency divided by two or the output audio data frequency divided by two, whichever is the lesser.

8. A frequency converter as claimed in claim 7, wherein the means for interpolating is substantially in accordance with a sinc interpolation function.

9. A frequency converter as claimed in claim 8, wherein said sinc interpolation function is substantially in accordance with:

$$x_c(t) = \frac{1}{f_s}\int_{-A}^{+A}\left[\sum_{k=-\infty}^{\infty} x[k]e^{-j2\pi\frac{Fk}{f_s}}\right]e^{j2\pi Ft}dF \text{ where}$$

$x_c(t) =$ output audio data
$x(t) =$ input audio data
$F_s =$ sampling frequency
$F' =$ output audio data frequency
$A =$ minimum $[Fs/2, F'/2]$
$x[k] =$ uniform samples of the input audio data $x(t)$
$k =$ sampling time with respect to frequency.

10. A frequency converter as claimed in claim 7, wherein said means for interpolating substantially filters said output audio data to remove an aliasing effect in a single step.

11. A frequency converter for conversion of input audio data, at an input audio data frequency, to output audio data, at an output audio data frequency, the frequency converter including:
    means for upsampling the input audio data by an integer factor, so as to increase a sampling rate of the input audio data to produce expanded data; and
    means for interpolating the expanded data to produce output audio data, wherein the interpolating is linear interpolation, said means for upsampling includes polyphase filters for filtering said expanded data, and said polyphase filters are in parallel and said means for upsampling includes a commutator for selecting outputs of the filters.

12. A frequency convert as claimed in claim 11, wherein the commutator at any one time selects only two outputs from the polyphase filters.

13. An apparatus, comprising:
    a first stage to sample input audio data having an input audio data frequency;
    a second stage coupled to the first stage to expand the input audio data to produce expanded data; and
    a third stage coupled to the second stage to interpolate the expanded data to produce output audio data having an output audio data frequency, wherein the third stage can interpolate to bandlimit the expanded data to either one of at least approximately a sampling frequency used by the first stage divided by two or at least approximately the output audio data frequency divided by two, whichever is less.

14. The apparatus of claim 13 wherein the third stage can substantially use a sinc interpolation function to interpolate the expanded data.

15. The apparatus of claim 13 wherein the third stage can substantially filter the output audio data to remove an aliasing effect during one interpolation.

16. The apparatus of claim 13, further comprising:
    a means for transitioning a signal output thereof from a condition at which the signal output is derived from a first input signal of a first frequency, applied to a first input of the means for transitioning, to a condition at which the signal output is derived from a second input signal of a second frequency, applied to a second input of the means for transitioning;
    a means for fading out the first input signal over a period and for fading in the second input signal over that period; and a means for combining the faded-out first input signal and the faded-in second input signal over that period and for applying the so combined input signals to the signal output.

17. An apparatus, comprising:
a first stage to upsample input audio data, having an input audio data frequency, by an integer factor to increase a sampling rate of the input audio data to produce expanded data; and
a second stage to interpolate the expanded data to produce output audio data, having an output audio data frequency, the second stage including at least one filter to filter the expanded data, the first stage including a commutator to select an output of the filter.

18. The apparatus of claim 17 wherein the second stage can use linear interpolation to interpolate the expanded data.

19. The apparatus of claim 17 wherein the at least one filter comprises a plurality of polyphase filters.

20. The apparatus of claim 19 wherein the polyphase filters are coupled in parallel.

21. The apparatus of claim 19 wherein the commutator can select only two outputs from the polyphase filters at any one time.

22. The apparatus of claim 17 wherein samples that can be used by the second stage to interpolate include denser samples of the expanded data and at least partially exclude less-denser samples of the expanded data.

23. The apparatus of claim 17 wherein the second stage can use sinc interpolation to interpolate the expanded data.

* * * * *